US010236848B2

United States Patent
Saito (10) Patent No.: US 10,236,848 B2
(45) Date of Patent: Mar. 19, 2019

(54) POWER AMPLIFIER MODULE (71) Applicant: Murata Manufacturing Co., Ltd., Kyoto (JP)

(72) Inventor: Kenji Saito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/038,665

(22) Filed: Jul. 18, 2018

(65) Prior Publication Data

US 2018/0342995 A1    Nov. 29, 2018

Related U.S. Application Data (60) Division of application No. 15/370,099, filed on Dec. 6, 2016, now Pat. No. 10,050,593, which is a
(Continued)

(30) Foreign Application Priority Data

Dec. 26, 2013 (JP) .................................. 2013-270071

(51) Int. Cl.
*H03F 3/21* (2006.01)
*H03F 3/19* (2006.01)
(Continued)

(52) U.S. Cl.
CPC .......... *H03G 1/0088* (2013.01); *H03F 1/0261* (2013.01); *H03F 1/56* (2013.01);
(Continued)

(58) Field of Classification Search
USPC ................................. 330/285, 302, 284, 296
See application file for complete search history.

(56) References Cited

U.S. PATENT DOCUMENTS 6,271,727 B1 * 8/2001 Schmukler ........... H03G 1/0058
330/284
6,683,511 B2 1/2004 Souetinov et al.
(Continued)

FOREIGN PATENT DOCUMENTS

JP   S54-028552 A    3/1979
JP   S62-263708 A   11/1987
(Continued)

OTHER PUBLICATIONS

Notice of Reasons for Rejection issued in Japanese Patent Application No. 2013-270071 dated Oct. 20, 2015.

*Primary Examiner* — Hieu P Nguyen
(74) *Attorney, Agent, or Firm* — Pearne & Gordon LLP (57) ABSTRACT

A power amplifier module includes a first bipolar transistor configured to amplify a radio frequency signal and output an amplified signal and a second bipolar transistor. A base of the second bipolar transistor is supplied with a control voltage for controlling attenuation of the radio frequency signal, and a collector the second bipolar transistor is supplied with a source voltage. The power amplifier module also includes a first resistor, where one end of the first resistor is connected to a supply path of the radio frequency signal to the first bipolar transistor, and a capacitor, where one end of the capacitor is connected to the other end of the first resistor and the other end of the capacitor is connected to the collector of the second bipolar transistor.

3 Claims, 7 Drawing Sheets

Related U.S. Application Data continuation of application No. 14/560,036, filed on Dec. 4, 2014, now Pat. No. 9,647,616.

(51) Int. Cl.
*H03F 1/02* (2006.01)
*H03G 1/00* (2006.01)
*H03F 1/56* (2006.01)
*H03F 3/24* (2006.01)

(52) U.S. Cl.
CPC .............. *H03F 3/19* (2013.01); *H03F 3/21* (2013.01); *H03F 3/245* (2013.01); *H03F 2200/18* (2013.01); *H03F 2200/387* (2013.01); *H03F 2200/411* (2013.01); *H03F 2200/451* (2013.01); *H03F 2200/504* (2013.01)

(56) References Cited

U.S. PATENT DOCUMENTS

| | | |
|---|---|---|
| 6,842,072 B1 | 1/2005 | Cheng |
| 8,258,876 B1 | 9/2012 | Osika |
| 8,461,929 B2 | 6/2013 | Yamamoto |
| 2011/0273248 A1 | 11/2011 | Nicolson |

FOREIGN PATENT DOCUMENTS

| | | |
|---|---|---|
| JP | 2004-350117 A | 9/2004 |
| JP | 2009-513040 A | 3/2009 |
| JP | 2011-239360 A | 11/2011 |
| JP | 2012-134627 A | 7/2012 |
| WO | 2007/035777 A2 | 3/2007 |

\* cited by examiner

| ATTEN-UATOR | MODE | CURRENT [mA] | | | | | GAIN [dB] |
|---|---|---|---|---|---|---|---|
| | | I1 | I2 | I3 | I4 | TOTAL | |
| A | LPM | 0.05 | 0.72 | 0.00 | 0.00 | 0.77 | 20.1 |
| | HPM | 0.00 | 0.00 | 0.00 | 0.00 | 0.00 | 25.1 |
| B | LPM | 0.26 | 0.39 | 0.00 | 0.00 | 0.65 | 20.3 |
| | HPM | 0.00 | 0.00 | 0.00 | 0.00 | 0.00 | 25.1 |
| C | LPM | 1.13 | 0.75 | 0.00 | 0.00 | 1.88 | 20.3 |
| | HPM | 0.00 | 0.00 | 1.46 | 0.58 | 2.04 | 25.1 |
| D | LPM | 0.80 | 0.41 | 0.00 | 0.00 | 1.20 | 20.5 |
| | HPM | 0.00 | 0.00 | 0.22 | 3.12 | 3.34 | 25.0 |
| E | LPM | 0.73 | 0.40 | 0.00 | 0.00 | 1.13 | 20.8 |
| | HPM | 0.00 | 0.00 | 0.20 | 3.04 | 3.24 | 25.1 |

POWER AMPLIFIER MODULE

BACKGROUND OF THE INVENTION

This is a division of U.S. patent application Ser. No. 15/370,099 filed on Dec. 6, 2016, which is a continuation of U.S. patent application Ser. No. 14/560,036 filed on Dec. 4, 2014, which claims priority from Japanese Patent Application No. 2013-270071 filed on Dec. 26, 2013. The contents of these applications are incorporated herein by reference in their entireties.

FIELD OF THE INVENTION

The present invention relates to a power amplifier module.

Background Art

In a power amplifier module that amplifies a radio frequency (RF) signal, an attenuator may be provided to reduce the gain of the power amplifier module in a low-power mode.

For example, Patent Document 1 discloses an attenuator that is shunt-connected to an input path of an RF signal to an amplification transistor. Specifically, the attenuator includes a field effect transistor (FET) and realizes attenuation control by controlling a voltage applied to the gate of the FET so as to switch the ON/OFF state of the FET.

CITATION LIST

Patent Document

[Patent Document 1] JP 2012-134627 A

SUMMARY OF THE INVENTION

As disclosed in Patent Document 1, the attenuator can be embodied using the FET, but when a bipolar transistor is used as the amplification transistor, the bipolar transistor and the FET are mixed in the power amplifier module, which causes an increase in the manufacturing cost.

The invention is made in consideration of the above-mentioned circumstances and an object thereof is to provide a power amplifier module including an attenuator employing a bipolar transistor.

According to an aspect of the invention, there is provided a power amplifier module including: a first bipolar transistor configured to amplify a radio frequency signal and output an amplified signal; a second bipolar transistor, a base of the second bipolar transistor being supplied with a control voltage for controlling attenuation of the radio frequency signal, and a collector the second bipolar transistor being supplied with a source voltage; a first resistor, one end of the first resistor being connected to a supply path of the radio frequency signal to the first bipolar transistor; and a capacitor, one end of the capacitor being connected to the other end of the first resistor, and the other end of the capacitor being connected to the collector of the second bipolar transistor.

According to the invention, it is possible to provide a power amplifier module including an attenuator employing a bipolar transistor.

DESCRIPTION OF THE PREFERRED EMBODIMENTS

Figure 1:
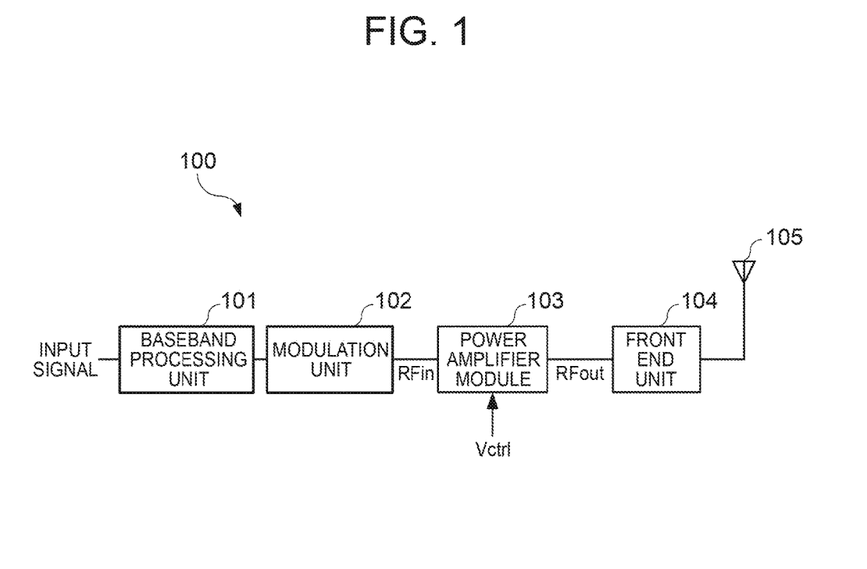
FIG. 1 is a diagram illustrating an example of a configuration of a transmitter unit including a power amplifier module according to an embodiment of the invention.

Hereinafter, an embodiment of the invention will be described with reference to the accompanying drawings. FIG. 1 is a diagram illustrating an example of a configuration of a transmitter unit including a power amplifier module according to an embodiment of the invention. A transmitter unit 100 is used to transmit various signals such as speech or data to a base station in mobile communication equipment such as a mobile phone. The mobile communication equipment further includes a receiver unit that receives signals from the base stations, but description thereof will not be made herein.

As illustrated in FIG. 1, the transmitter unit 100 includes a baseband processing unit 101, a modulation unit 102, a power amplifier module 103, a front end unit 104, and an antenna 105.

The baseband processing unit 101 performs baseband processing on an input signal.

The modulation unit 102 modulates a baseband signal on the basis of a modulation method such as a global system for mobile communications (GSM®) method or an enhanced data GSM environment (EDGE) method and generates a radio frequency (RF) signal to be wirelessly transmitted. The frequency of the RF signal ranges, for example, from several hundred MHz to several GHz.

The power amplifier module 103 amplifies power of the RF signal (RFin) up to a level necessary for transmission to a base station and outputs the amplified signal (RFout). The operating modes of the power amplifier module 103 include a low-power mode (LPM) and a high-power mode (HPM). The operating modes of the power amplifier module 103 are controlled by a control voltage Vctrl supplied from outside. As will be described later, in the power amplifier module 103, it is possible to reduce the gain of the power amplifier module 103 by operating an attenuator in the low-power mode. In the power amplifier module 103, it may be possible to reduce the number of transistors operated (the number of fingers) in the low-power mode.

The front end unit 104 performs filtering on the output signal, switching with a reception signal received from the base station, or the like. The signal output from the front end unit 104 is transmitted to the base station via the antenna 105.

Figure 2:
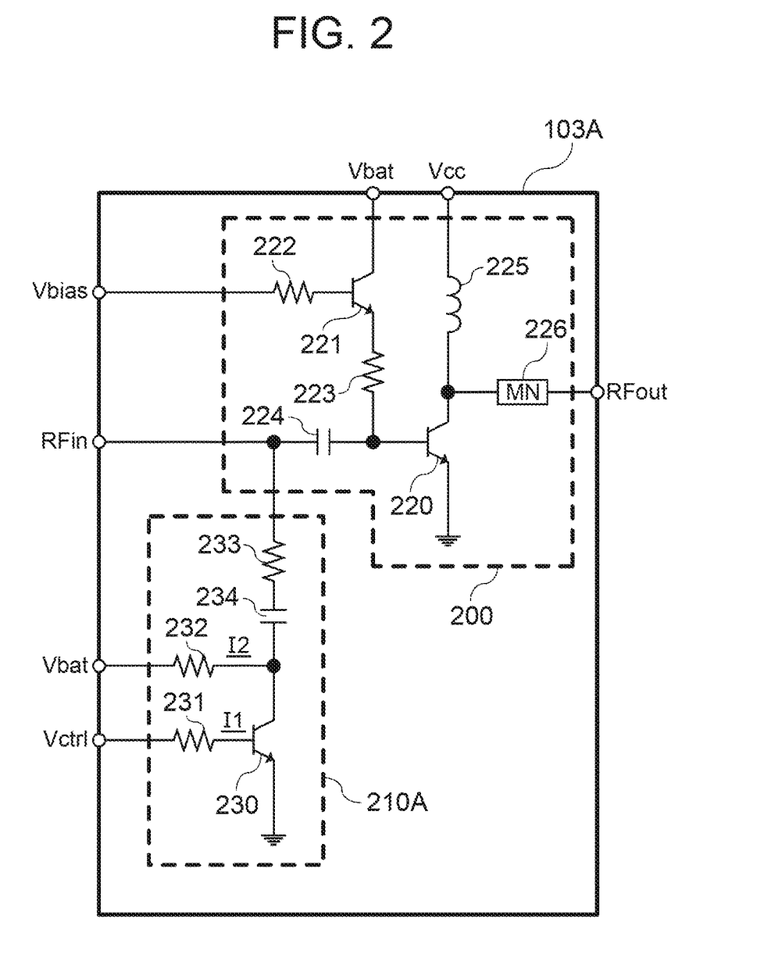
FIG. 2 is a diagram illustrating an example of a configuration of a power amplifier module.

FIG. 2 is a diagram illustrating an example of a configuration of the power amplifier module 103. A power amplifier module 103A includes an amplifier 200 and an attenuator 210A. The transistors constituting the power amplifier module 103A are bipolar transistors. For example, each transistor may employ a heterojunction bipolar transistor (HBT) of a compound semiconductor such as GaAs. In FIG. 2, the amplifier includes only a single stage, but the power amplifier module 103 may include multi-stage amplifiers. The same is true of other configurations to be described later.

The amplifier 200 amplifies an input RF signal (RFin) and outputs an amplified signal (RFout). As illustrated in FIG. 2, the amplifier 200 includes transistors 220 and 221, resistors 222 and 223, a capacitor 224, an inductor 225, and a matching network (MN) 226.

The transistor 220 (the first bipolar transistor) is an amplification element that amplifies an RF signal (RFin). The RF signal (RFin) is input to the base of the transistor 220 via the capacitor 224, and the collector of the transistor 220 is supplied with a source voltage (for example, a source voltage Vcc output from a regulator) via the inductor 225. An amplified signal (RFout) obtained by amplifying the RF signal (RFin) is output from the collector of the transistor 220 via the matching network 226.

The transistor 221 is an element that supplies a bias voltage to the transistor 220. The base of the transistor 221 is supplied with a bias control voltage Vbias for controlling a bias via the resistor 222. The collector of the transistor 221 is supplied with a source voltage (for example, a battery voltage Vbat). The emitter of the transistor 221 is connected to the base of the transistor 220 via the resistor 223.

The attenuator 210A serves to reduce the gain of the power amplifier module 103A. Specifically, the attenuator 210A can reduce the gain of the power amplifier module 103A by attenuating the RF signal (RFin) supplied to the transistor 220 in the low-power mode. As illustrated in FIG. 2, the attenuator 210A includes a transistor 230, resistors 231 to 233, and a capacitor 234.

The transistor 230 (the second bipolar transistor) is an element that is turned on/off in response to the control voltage Vctrl to control the ON/OFF states of an attenuation function. The base of the transistor 230 is supplied with the control voltage Vctrl via the resistor 231. The collector of the transistor 230 is supplied with a source voltage (for example, a battery voltage Vbat) via the resistor 232.

One end of the resistor 233 is connected to a supply path of the RF signal (RFin) to the transistor 220 and the other end of the resistor 233 is connected to one end of the capacitor 234. The other end of the capacitor 234 is connected to the collector of the transistor 230. The resistor 233 is an element that attenuates the RF signal (RFin) using a current flowing in the resistor 233 when the transistor 230 is turned on. The capacitor 234 is a DC blocking element that prevents a DC component of the collector of the transistor 230 from being supplied to the supply path of the RF signal (RFin) to the transistor 220.

In the power amplifier module 103A illustrated in FIG. 2, the control voltage Vctrl is set to a high level in the low-power mode and is set to a low level in the high-power mode. When the control voltage Vctrl is at the high level in the low-power mode, the transistor 230 is turned on and a part of the RF signal (RFin) flows into the transistor 230 via the resistor 233. Accordingly, the RF signal (RFin) is attenuated and thus the gain of the power amplifier module 103A is reduced. On the other hand, when the control voltage Vctrl is at the low level in the high-power mode, the transistor 230 is turned off, the RF signal (RFin) does not flow into the resistor 233, and thus the RF signal (RFin) is supplied to the transistor 220 without being attenuated.

In this way, in the power amplifier module 103A illustrated in FIG. 2, both of the amplifier 200 and the attenuator 210A can be constituted by bipolar transistors. Accordingly, it is possible to suppress the manufacturing cost of the power amplifier module, compared with the case in which the amplifier is constituted by a bipolar transistor and the attenuator is constituted by an FET.

Figure 3:
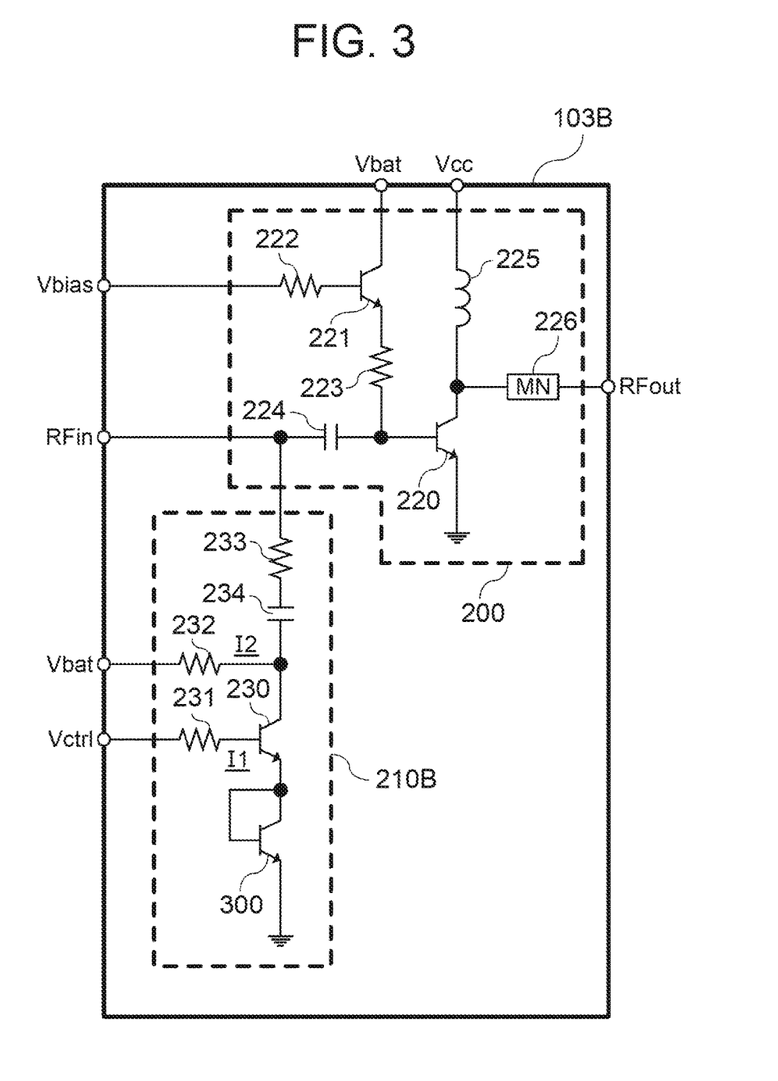
FIG. 3 is a diagram illustrating another example of a configuration of a power amplifier module.

FIG. 3 is a diagram illustrating another example of the configuration of the power amplifier module. The same elements as illustrated in FIG. 2 will be referenced by the same reference numerals and description thereof will not be repeated. As illustrated in FIG. 3, a power amplifier module 103B includes an attenuator 210B instead of the attenuator 210A in the power amplifier module 103A illustrated in FIG. 2. The attenuator 210B includes a transistor 300 in addition to the elements of the attenuator 210A.

The base of the transistor 300 (the third bipolar transistor) is connected to the collector of the transistor 300, the collector of the transistor 300 is connected to the emitter of the transistor 230, and the emitter of the transistor 300 is grounded. That is, the transistor 300 is a diode-connected transistor and is connected to the ground side of the transistor 230. In this way, by disposing the diode-connected transistor 300 on the ground side of the transistor 230, it is possible to reduce the base-emitter voltage of the transistor 230 and thus to reduce a DC current (that is, a current I2 flowing in the resistor 232) flowing in the transistor 230 in the low-power mode.

Figure 4:
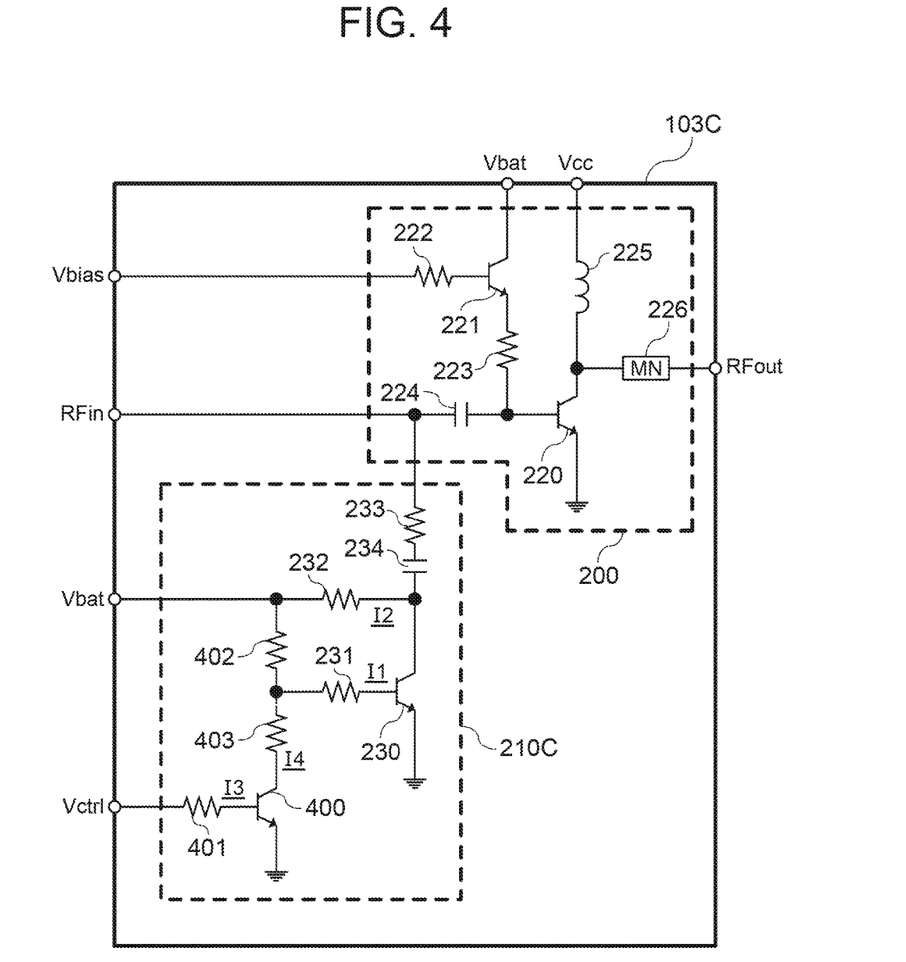
FIG. 4 is a diagram illustrating still another example of a configuration of a power amplifier module.

FIG. 4 is a diagram illustrating still another example of the configuration of the power amplifier module. The same elements as illustrated in FIG. 2 will be referenced by the same reference numerals and description thereof will not be repeated. As illustrated in FIG. 4, a power amplifier module 103C includes an attenuator 210C instead of the attenuator 210A in the power amplifier module 103A illustrated in FIG. 2. The attenuator 210C includes a transistor 400 and resistors 401 to 403 in addition to the elements of the attenuator 210A.

The base of the transistor 400 (the fourth bipolar transistor) is supplied with the control voltage Vctrl via the resistor 401. The collector of the transistor 400 is supplied with the source voltage (for example, the battery voltage Vbat) via the resistor 402 (the second resistor) and the resistor 403 (the third resistor). The base of the transistor 230 is connected to a connecting point of the resistors 402 and 403 via the resistor 231.

In the power amplifier module 103C, unlike the power amplifier module 103A illustrated in FIG. 2, the control voltage Vctrl is set to a low level in the low-power mode and is set to a high level in the high-power mode. That is, the attenuation function of the attenuator 210C is turned on when the control voltage Vctrl is at the low level, unlike the attenuator 210A illustrated in FIG. 2.

When the control voltage Vctrl is at the low level in the low-power mode, the transistor 400 is turned off, the battery voltage Vbat is supplied to the base of the transistor 230, and thus the transistor 230 is turned on. Accordingly, a part of the RF signal (RFin) flows into the transistor 230 via the resistor 233 and the RF signal (RFin) is attenuated.

On the other hand, when the control voltage Vctrl is at the high level in the high-power mode, the transistor 400 is turned on. At this time, the base of the transistor 230 is supplied with a voltage, which is obtained by dividing the battery voltage Vbat by the use of the resistors 402 and 403, via the resistor 231. That is, the voltage supplied to the base of the transistor 230 decreases and the transistor 230 is turned off. Accordingly, the RF signal (RFin) does not flow into the resistor 233 and the RF signal (RFin) is supplied to the transistor 220 without being attenuated.

In this way, in the power amplifier module 103C, the low-power mode can be set up when the control voltage Vctrl is at the low level. That is, the power amplifier module 103C can be suitably applied to a transmitter module in which the control voltage Vctrl is designed to the low level in the low-power mode.

Figure 5:
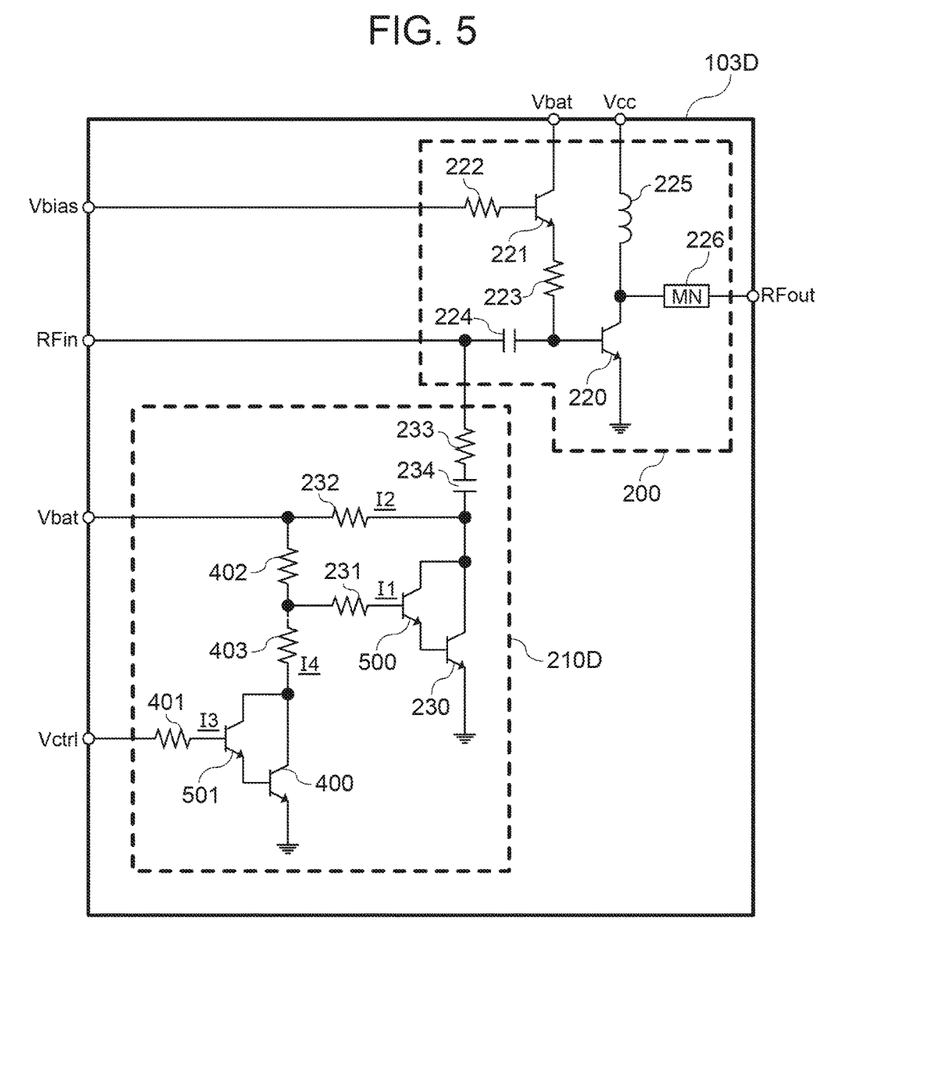
FIG. 5 is a diagram illustrating still another example of a configuration of a power amplifier module.

FIG. 5 is a diagram illustrating still another example of the configuration of the power amplifier module. The same elements as illustrated in FIG. 4 will be referenced by the same reference numerals and description thereof will not be repeated. As illustrated in FIG. 5, a power amplifier module 103D includes an attenuator 210D instead of the attenuator 210C in the power amplifier module 103C illustrated in FIG. 4. The attenuator 210D includes transistors 500 and 501 in addition to the elements of the attenuator 210C.

The base of the transistor 500 (the fifth bipolar transistor) is connected to a connecting point of the resistors 402 and 403 via the resistor 231. The collector of the transistor 500 is supplied with the source voltage (for example, the battery voltage Vbat) via the resistor 232. The emitter of the transistor 500 is connected to the base of the transistor 230. That is, the transistors 230 and 500 form a Darlington transistor.

The base of the transistor 501 (the sixth bipolar transistor) is supplied with the control voltage Vctrl via the resistor 401. The collector of the transistor 501 is supplied with the source voltage (for example, the battery voltage Vbat) via the resistors 402 and 403. The emitter of the transistor 501 is connected to the base of the transistor 400. That is, the transistors 400 and 501 form a Darlington transistor.

The operation of the attenuator 210D is the same as the attenuator 210C illustrated in FIG. 4. That is, when the control voltage Vctrl is at the low level in the low-power mode, the transistors 400 and 501 are turned off and the transistors 230 and 500 are turned on, thereby performing the attenuation of the RF signal (RFin). On the other hand, when the control voltage Vctrl is at the high level in the high-power mode, the transistors 400 and 501 are turned on and the transistors 230 and 500 are turned off, thereby not performing the attenuation of the RF signal (RFin).

In the attenuator 210D, since the transistors 400 and 501 form a Darlington transistor, it is possible to reduce the base current I3 flowing in the resistor 401, compared with the attenuator 210C.

In the attenuator 210D, since the transistors 230 and 500 form a Darlington transistor, a threshold voltage for turning on the transistors 230 and 500 is higher than the threshold voltage for turning on the transistor 230 in the attenuator 210C. Accordingly, particularly, when the signal level of the RF signal (RFin) is high, it is possible to preventing a leakage current from flowing in the transistor 230 in the high-power mode, compared with the attenuator 210C.

Figure 6:
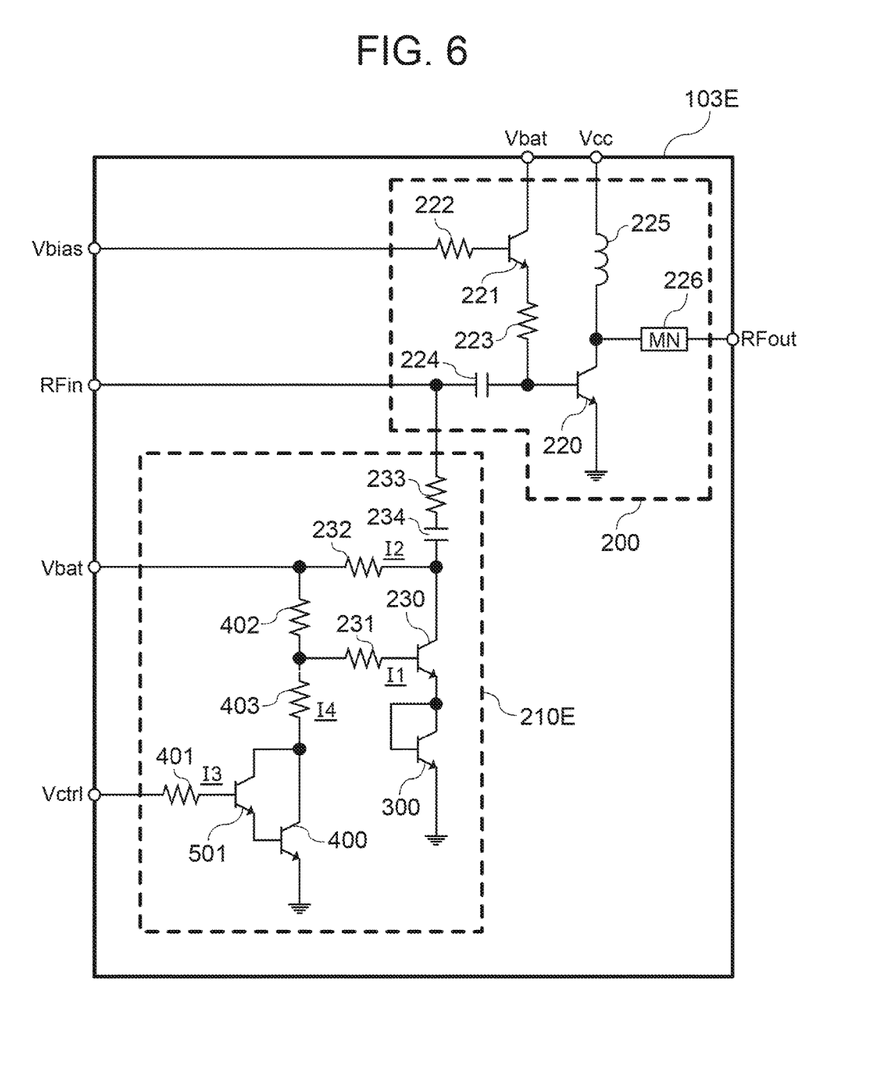
FIG. 6 is a diagram illustrating still another example of a configuration of a power amplifier module.

FIG. 6 is a diagram illustrating still another example of the configuration of the power amplifier module. The same elements as illustrated in FIG. 3 or 5 will be referenced by the same reference numerals and description thereof will not be repeated. As illustrated in FIG. 6, a power amplifier module 103E includes an attenuator 210E instead of the attenuator 210D in the power amplifier module 103D illustrated in FIG. 5. The attenuator 210E includes the transistor 300 illustrated in FIG. 3 instead of the transistor 500 in the attenuator 210D. Similarly to the attenuator 210B illustrated in FIG. 3, the transistor 300 is a diode-connected transistor and is disposed on the ground side of the transistor 230.

Figure 7:
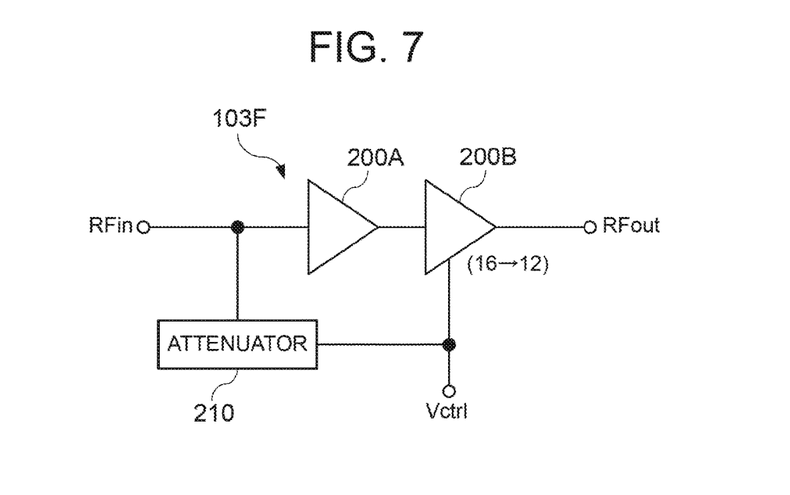
FIG. 7 is a diagram illustrating a configuration of a power amplifier module subjected to a simulation for current consumption.

FIG. 7 is a diagram illustrating a configuration of a power amplifier module subjected to a simulation for current consumption. As illustrated in FIG. 7, a power amplifier module 103F includes two-stage amplifiers 200A and 200B and an attenuator 210. The amplifiers 200A and 200B have the same configuration as the amplifier 200 illustrated in FIGS. 2 to 6. The simulation is carried out on the configurations employing the attenuators 210A to 210E illustrated in FIGS. 2 to 6 as the attenuator 210. In the simulation, the number of fingers of the transistor 220 constituting the amplifier 200B is set to 16 and the number of fingers operated is reduced to 12 in the low-power mode.

Figure 8:
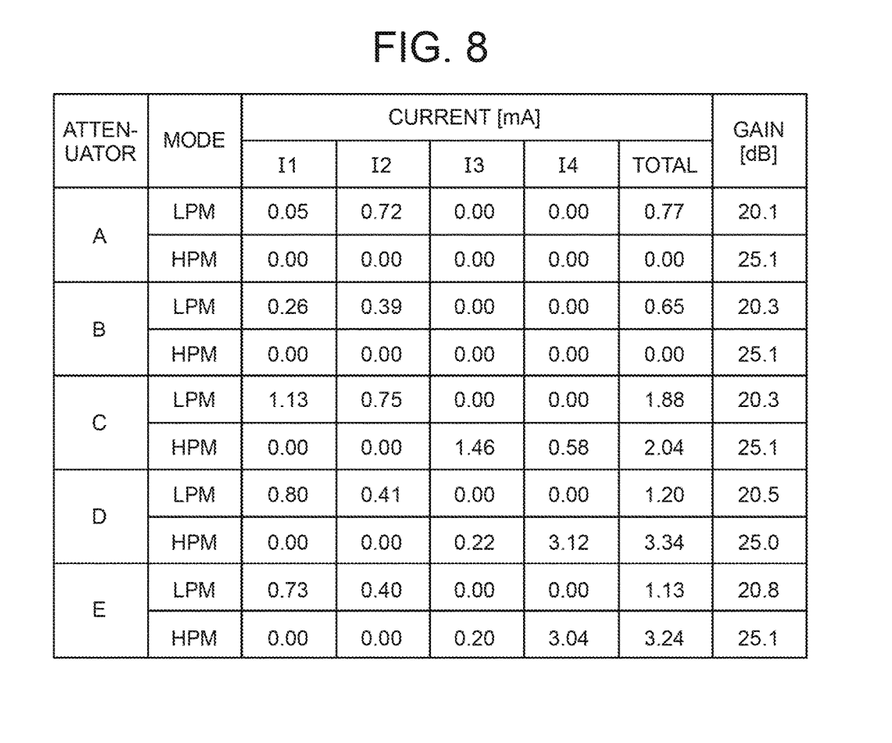
FIG. 8 is a diagram illustrating a simulation result for current consumption.

FIG. 8 is a diagram illustrating the simulation results for the current consumption. Currents I1 to I4 are sequentially currents flowing in the resistors 231 and 232 and the resistors 401 and 403 of the attenuators 210A to 210E illustrated in FIGS. 2 to 6. In the table illustrated in FIG. 8, values A to E in the column of the attenuator correspond to the attenuators 210A to 210E. As illustrated in FIG. 8, in any configuration, the gain in the low-power mode is about 20 dB and the gain in the high-power mode is about 25 dB.

Comparing the attenuator 210A with the attenuator 210B, it can be seen that the current consumption in the attenuator 210B is lower. As described above, this is because the diode-connected transistor 300 is disposed on the ground side of the transistor 230 in the attenuator 210B and thus the current I2 is reduced.

Comparing the attenuator 210C with the attenuator 210D, it can be seen that the current consumption in the low-power mode of the attenuator 210D is lower. As described above, this is because the transistors 400 and 501 in the attenuator 210D form a Darlington transistor.

Hitherto, embodiments of the invention have been described. According to one embodiment, both of the amplifier 200 and the attenuator 210 can be constituted by bipolar transistors. Accordingly, it is possible to suppress the manufacturing cost of the power amplifier module, compared with the case in which the amplifier is constituted by a bipolar transistor and the attenuator is constituted by an FET.

According to another embodiment, it is also possible to reduce the current consumption by disposing the diode-connected transistor 300 on the ground side of the transistor 230, as illustrated in FIG. 3.

According to another embodiment, it is also possible to perform control so as to turn on the attenuation function when the control voltage Vctrl is at the low level, by disposing the transistor 400 and the resistors 401 to 403, as illustrated in FIG. 4.

According to another embodiment, it is also possible to reduce the current consumption by the Darlington transistor formed from transistors 400 and 501, as illustrated in FIG. 5. By forming a Darlington transistor comprising the transistors 230 and 500, it is possible to prevent a leakage current from flowing in the transistor 230 when the signal level of the RF signal (RFin) is high.

According to another embodiment, it is also possible to reduce the power consumption by disposing the diode-connected transistor 300 on the ground side of the transistor 230, as illustrated in FIG. 6.

The embodiments are for easy understanding of the invention, but not for restrictively analyzing the invention. The invention can be modified/improved without departing from the gist thereof and equivalents thereof are included in the invention.

DESCRIPTION OF REFERENCE NUMERALS

100: transmitter unit
101: baseband processing unit
102: modulation unit
103: power amplifier module
104: front end unit

105: antenna
200: amplifier
210: attenuator
220, 221, 230, 300, 400, 401, 500, 501: transistor
222, 223, 231 to 233, 401 to 403: resistor
224, 234: capacitor
225: inductor
226: matching network

What is claimed is:

1. A power amplifier module comprising:
a first bipolar transistor configured to amplify a radio frequency signal and output an amplified signal;
a second bipolar transistor, a base of the second bipolar transistor being supplied with a control voltage for controlling attenuation of the radio frequency signal, and a collector of the second bipolar transistor being supplied with a source voltage;
a first resistor, one end of the first resistor being connected to a supply path of the radio frequency signal to the first bipolar transistor;
a capacitor, one end of the capacitor being connected to another end of the first resistor, and another end of the capacitor being connected to the collector of the second bipolar transistor;
a second resistor;
a third resistor connected in series to the second resistor;
a fourth bipolar transistor, a base of the fourth bipolar transistor being supplied with the control voltage, and a collector of the fourth bipolar transistor being supplied with the source voltage via the second and third resistors;
a fifth bipolar transistor, a base of the fifth bipolar transistor being connected to a connecting point of the second and third resistors, a collector of the fifth bipolar transistor being connected to the collector of the second bipolar transistor, and an emitter of the fifth bipolar transistor being connected to the base of the second bipolar transistor; and
a sixth bipolar transistor, a base of the sixth bipolar transistor being supplied with the control voltage, a collector of the sixth bipolar transistor being connected to the collector of the fourth bipolar transistor, and an emitter of the sixth bipolar transistor being connected to the base of the fourth bipolar transistor,
wherein the base of the second bipolar transistor is connected to the connecting point of the second and third resistors.

2. The power amplifier module according to claim 1, wherein each of the first bipolar transistor, the second bipolar transistor, the fourth bipolar transistor, the fifth bipolar transistor, and the sixth bipolar transistor is a transistor of a compound semiconductor.

3. The power amplifier module according to claim 1, wherein the first bipolar transistor configured to amplify a radio frequency signal and output an amplified signal is part of a multi-stage amplifier.

* * * * *